United States Patent [19]

Dekker et al.

[11] Patent Number: 5,221,856
[45] Date of Patent: Jun. 22, 1993

[54] BIPOLAR TRANSISTOR WITH FLOATING GUARD REGION UNDER EXTRINSIC BASE

[75] Inventors: Ronald Dekker; Martinus C. A. M. Koolen; Henricus G. R. Maas, all of Eindhoven, Netherlands

[73] Assignee: U.S. Philips Corp., New York, N.Y.

[21] Appl. No.: 833,599

[22] Filed: Feb. 10, 1992

Related U.S. Application Data

[63] Continuation of Ser. No. 504,190, Apr. 2, 1990, abandoned.

[30] Foreign Application Priority Data

Apr. 5, 1989 [GB] United Kingdom ............... 8907611
Nov. 10, 1989 [GB] United Kingdom ............... 8925519

[51] Int. Cl.⁵ .......................................... H01L 29/73
[52] U.S. Cl. .................................. 257/518; 257/488; 257/495; 257/592
[58] Field of Search ............... 357/34, 50, 59 H, 53, 357/13, 22 D, 22 E; 257/488, 495, 592, 518

[56] References Cited

U.S. PATENT DOCUMENTS

| | | | |
|---|---|---|---|
| 4,377,816 | 3/1983 | Sittig | 357/13 |
| 4,706,378 | 11/1987 | Havemann | 357/34 |
| 4,969,026 | 11/1990 | Van der Velden et al. | 357/34 |
| 4,980,748 | 12/1990 | Hozumi et al. | 357/50 |
| 4,984,053 | 1/1991 | Kayanuma | 357/20 |

Primary Examiner—William D. Larkins
Attorney, Agent, or Firm—Steven R. Biren

[57] ABSTRACT

A first device region (10) of one conductivity type adjacent one major surface (1a) of a semiconductor body (1) has a relatively highly doped subsidiary region (11) spaced from the one major surface (1a) by a relatively lowly doped subsidiary region (12). A second device region (20) of the opposite conductivity type within the subsidiary region (12) has an intrinsic subsidiary region (21) and an extrinsic subsidiary region (23,24) surrounding the intrinsic subsidiary region (21) forming respective first and second pn junctions (22,25) with the relatively lowly doped subsidiary region (12). A third device region (30) of the one conductivity type is formed within the intrinsic subsidiary region (21) surface (1a). An additional region (60,60',61,62) is provided beneath the extrinsic subsidiary region (23,24) so as to lie within the spread of the depletion region (250) associated with the second pn junction (25) when the first and second pn junction (22,25) are reverse-biassed thereby extending the depletion region (250) beneath the emitter region (30) to cause an increase in the Early voltage ($V_{eaf}$) of the device.

8 Claims, 7 Drawing Sheets

BIPOLAR TRANSISTOR WITH FLOATING GUARD REGION UNDER EXTRINSIC BASE

This is a continuation of application Ser. No. 07/504,190, filed Apr. 2, 1990 now abandoned.

BACKGROUND OF THE INVENTION

This invention relates to a semiconductor device, particularly but not exclusively a vertical bipolar transistor, and to a method of manufacturing such a semiconductor device.

A semiconductor device has previously been proposed, as described in, for example, Washio et al IEEE transactions on Electron Devices Vol. 35, No. 10, October 1988, which comprises a semiconductor body having adjacent one major surface a first device region of one conductivity type having a relatively highly doped subsidiary region spaced from the one major surface by a relatively lowly doped subsidiary region, a second device region of the opposite conductivity type formed within the relatively lowly doped subsidiary region of the first device region adjacent the one major surface and having an intrinsic subsidiary region forming a first pn junction with the relatively lowly doped subsidiary region and an extrinsic subsidiary region surrounding the intrinsic subsidiary region and forming a second pn junction with the relatively lowly doped subsidiary region, the first and second pn junctions being reverse-biassed in at least one mode of operation of the device, and a third device region of the one conductivity type formed within the intrinsic subsidiary region adjacent the one major surface.

The device described in the aforementioned paper is a vertical bipolar transistor, the word vertical being understood herein to refer to a device in which the main current flow is between opposed major surfaces of the semiconductor body. The relatively lowly doped subsidiary region which forms part of the collector region is defined as a mesa structure having a side wall bounded by an insulating region and the extrinsic subsidiary region of the second device, that is the base, region is formed by diffusion of impurities out of a doped connection layer provided on the insulating region into the mesa structure via its side wall with the doped connection layer enabling electrical contact to be made to the base region. This paper is concerned with the fact that the extrinsic base region can extend quite close to the relatively highly doped subsidiary region of the collector region, resulting in a high collector-base junction capacitance which will cause a reduction in breakdown voltage and detrimentally affect the high frequency performance. In order to enable the extrinsic base subsidiary region to be well spaced from the relatively high doped collector region so as to avoid excessively high collector-base junction capacitances which would otherwise cause a reduction in the collector-base breakdown voltage, this paper proposes a relatively complicated two-step oxidation process which enables the insulating region to be relatively thick and which reduces the size of the window via which impurities from the doped connection layer diffuse into the mesa structure at its side wall.

In addition to the problem discussed above, the Early effect is an important consideration when designing such bipolar transistors. This effect, which causes an increase in current amplification $\beta_o$(hfe) with collector-emitter voltage $V_{CE}$ and thus a lack of saturation in the common-emitter output characteristics of the transistor, results from the modulation of the base width $W_B$ with the collector-emitter voltage $V_{CE}$. The voltage to which the output characteristic curves of collector current $I_c$ against $V_{CE}$ for different base currents $I_B$ can be extrapolated at $V_{CE}=0$ is referred to as the Early voltage $V_{eaf}$. It is an aim of the designers of, in particular, analog bipolar transistors suitable for use in integrated circuits to increase, that is make more negative, the Early voltage $V_{eaf}$ because this implies a smaller change in $\beta_o$ with $V_{CE}$ and thus more linear characteristics for the transistor.

SUMMARY OF THE INVENTION

It is an aim of the present invention to provide a semiconductor device, such as a vertical bipolar transistor, for which an improvement of the Early effect, that is a more negative Early voltage $V_{eaf}$, can be obtained.

According to one aspect of the present invention, there is provided a semiconductor body having adjacent one major surface a first device region of one conductivity type having a relatively highly doped subsidiary region spaced from the one major surface by a relatively lowly doped subsidiary region, a second device region of the opposite conductivity type formed within the relatively lowly doped subsidiary region of the first device region adjacent the one major surface and having an intrinsic subsidiary region forming a first pn junction with the relatively lowly doped subsidiary region and an extrinsic subsidiary region surrounding the intrinsic subsidiary region and forming a second pn junction with the relatively lowly doped subsidiary region, the first and second pn junctions being reverse-biassed in at least one mode of operation of the device, and a third device region of the one conductivity type formed within the intrinsic subsidiary region adjacent the one major surface, characterized in that an additional region is provided beneath the extrinsic subsidiary region and lying within the spread of the depletion region associated with the second pn junction when the first and second pn junctions are reverse-biassed in the one mode of operation of the device for causing the depletion region associated with the second pn junction to extend beneath the third device region so as to overlap with the depletion region associated with the first pn junction.

According to another aspect of the present invention, there is provided a method of manufacturing a semiconductor device, which method comprises providing a semiconductor body having adjacent one major surface a first device region of one conductivity type having a relatively highly doped subsidiary region spaced from the one major surface by a relatively lowly doped subsidiary region, introducing impurities into the semiconductor body to form adjacent the one major surface within the relatively lowly doped subsidiary region of the first device region a second device region of the opposite conductivity type having an intrinsic subsidiary region forming a first pn junction with the relatively lowly doped subsidiary region and an extrinsic subsidiary region surrounding the intrinsic subsidiary region and forming a second pn junction with the relatively lowly doped subsidiary region of the first device region, and introducing impurities to form a third device region of the one conductivity type within the intrinsic subsidiary region adjacent the one major surface, characterized by providing an additional region beneath the extrinsic subsidiary region and lying within the spread of the depletion region associated with the second pn junction when the first and second pn junctions are reverse-biassed in the one mode of operation of the device for causing the depletion region associated with the second pn junction to extend beneath the third device region so as to overlap with the depletion region associated with the first pn junction.

Thus, in a device embodying the invention, when the first and second pn junctions are reverse-biassed in operation of the device, the additional region causes the depletion region associated with the second pn junction to be spread laterally so as to extend beneath the third device region thereby effectively increasing the space-charge region associated with the first pn junction and reducing the intrinsic base-collector capacitance to result in an increased (that is more negative) Early voltage. In addition, the extension of the depletion region caused by the presence of the additional region should result in an increased breakdown voltage because the effective doping of the relatively lowly doped subsidiary region is reduced by the extension of the depletion region. Thus, a higher breakdown voltage can be achieved without having to reduce the actual doping, and so thus without having to increase the resistance, of the relatively lowly doped subsidiary region. The effect of the extension of the depletion region may be of particular importance where the third device region (the emitter region in the case of a bipolar transistor) has a width (that is the dimension parallel to the one major surface) of less than about 5µm micrometers.

The relatively lowly doped subsidiary region of the first device region may define a mesa structure having a side wall bounded by an insulating region. The mesa structure may be defined by etching as, for example, in the case of the type of bipolar transistor described in the aforementioned paper or may be defined by insulating regions formed by local oxidation of the semiconductor material at the one major surface.

The additional region may comprise a relatively highly doped region of the opposite conductivity type formed in the mesa structure by diffusion of impurities from a doped layer provided on the insulating region and adjoining the side wall of the mesa structure. This provides a relatively simple way of forming a relatively highly doped floating region positioned to lie within the spread of the depletion region of the second pn junction in the one mode of operation of the device so as to cause this depletion region to spread laterally so as to extend beneath the third device region and thus increase the Early voltage and reverse breakdown voltage of the device.

In an alternative embodiment the additional region may similarly be formed as a floating region lying within the spread of the depletion region of the second pn junction in the one mode of operation of the device by implanting impurities of the opposite conductivity type into the mesa structure via the one major surface. Where the relatively lowly doped subsidiary region is defined as a mesa structure bounded by an insulating region, the floating region may be formed in a self-aligned manner. Using this arrangement enables devices with and without the additional region to be formed within the same semiconductor body simply by masking the areas where the devices without the additional region are being formed during the implantation of the impurities to form the additional region. This enables devices with relatively low Early voltages and breakdown voltages but very good high frequency performance to be formed in the same semiconductor body as devices which incorporate the additional region and so have relatively high Early voltages and breakdown voltages but worse high frequency performance. Such a facility may be particularly advantageous in, for example, the manufacture of analog bipolar integrated circuits for use in television sets where bipolar transistors with good high frequency characteristics are required in the antenna stage while bipolar transistors with high Early voltages and breakdown voltages are required in the amplifying and down-converter stages.

Where the additional region is, as in the examples described above, formed by introduction of impurities into the relatively lowly doped subsidiary region, then it may be possible, by controlling the shape of the additional region, to control the shape of the depletion region associated with the second pn junction so as, for example, to increase the lateral spread of the depletion region beneath the third device region relative to its spread towards the relatively highly doped subsidiary region of the first device region to enhance the increase in the Early voltage.

In a further alternative embodiment, a doped layer may be provided on the insulating region and separated from the side wall of the mesa structure by a thin insulating layer for defining the additional region as a depletion layer region within which a depletion layer is formed by applying a voltage to the doped layer. Such an arrangement enables an increase in the Early voltage without a significant increase in the capacitance between the extrinsic subsidiary region and the relatively highly doped subsidiary region of the first device region. Where the extrinsic subsidiary region adjoins a doped connection layer provided on the insulating region with at least a contact portion of the extrinsic subsidiary region being provided by diffusion of impurities from the doped connection layer, the doped layer defining the depletion layer region may be contiguous with the doped connection layer. In this case it is not necessary to provide a separate electrical contact to the doped layer because the voltage applied via the doped connection layer in the one mode of operation of the device serves to form the depletion layer. Alternatively, the doped layer may be electrically isolated from the doped connection layer and a separate electrical contact provided to the doped layer enabling the depletion layer (or even an inversion channel) to be controlled independently of the base voltage.

BRIEF DESCRIPTION OF THE DRAWING

Embodiments of the invention will now be described, by way of example, with reference to the accompanying drawings, in which.

It should be understood that FIGS. 1 to 17 are not to scale and that various dimensions, especially the thickness of regions or layers may have been relatively exaggerated or reduced in the interests of clarity.

DESCRIPTION OF THE PREFERRED EMBODIMENTS

Figure 16:
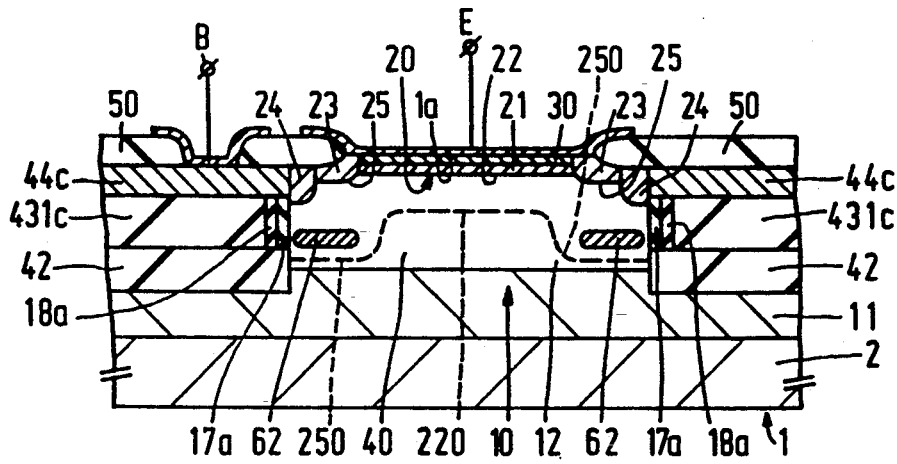
FIG. 16 is a schematic cross-sectional view similar to FIG. 7 of a bipolar transistor in accordance with the fourth embodiment.

Referring now to the drawings, for example FIG. 16, there is illustrated a semiconductor device comprising a semiconductor body 1 having at one major surface 1a a first device region 10 of one conductivity type having a relatively highly doped subsidiary region 11 spaced from the one major surface 1a by a relatively lowly doped subsidiary region 12, a second device region 20 of the opposite conductivity type formed within the relatively lowly doped subsidiary region 12 of the first device region 10 adjacent the one major surface 1a and having an intrinsic subsidiary region 21 forming a first pn junction 22 with the relatively lowly doped subsidiary region 12 and an extrinsic subsidiary region 23,24 surrounding the intrinsic subsidiary region 21 and forming a second pn junction 25 with the relatively lowly doped subsidiary region 12, the first and second pn junctions 22 and 25 being reverse-biassed in at least one mode of operation of the device, and a third device region 30 of the one conductivity type formed within the intrinsic subsidiary region 21 adjacent the one major surface 1a.

In accordance with the invention, an additional region 60, 60', 61 or 62 is provided beneath the extrinsic subsidiary region 23,24 and lying within the spread of the depletion region 250 associated with the second pn junction 25 when the first and second pn junctions 22,25 are reverse-biassed in the one mode of operation of the device for causing the depletion region 250 (see for example FIG. 17) associated with the second pn junction 25 to extend beneath the third device region 30 so as to overlap with the depletion region 220 associated with the first pn junction 22. The depletion regions 220 and 250 are shown unhatched in FIGS. 8, 11, 14 and 17. This overlapping of the depletion regions 220 and 250 effectively increases the space-charge region associated with the first pn junction 22 and thus results in a reduction of intrinsic base-collector capacitance and so, as will be explained below, in an increased (that is more negative) Early voltage $V_{eaf}$.

Figure 1:
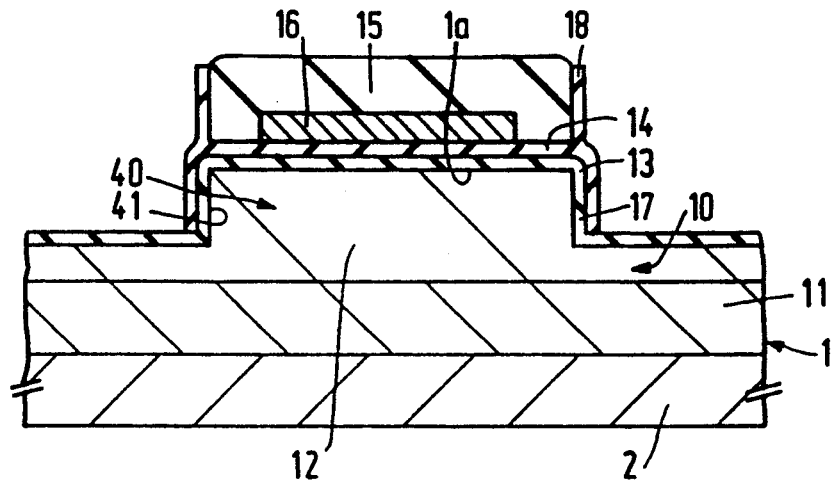
FIGS. 1 to 6 are schematic cross-sectional views of part of a semiconductor body illustrating steps in a method of manufacturing a bipolar transistor in accordance with the invention.

Referring now to FIGS. 1 to 7, there is illustrated a method in accordance with the invention for manufacturing a first embodiment of a bipolar transistor embodying the invention. As shown in FIG. 1, the semiconductor body 1 comprises, in this example, a monocrystalline silicon substrate 2 (only part of which is shown) doped with impurities of the opposite conductivity type, p conductivity type in this example, into which impurities of the one conductivity type, n conductivity type in this example, have been implanted to form the relatively highly doped subsidiary region 11 of the first device region 10 which will form the collector region of the bipolar transistor.

The relatively highly doped region 11 is then covered by an epitaxially grown layer of silicon which is relatively lowly doped with impurities of the one conductivity type and which forms the relatively lowly doped region 12 of the collector region 10. Typically the relatively lowly doped region 12 may be about 1 micrometer thick and may have a dopant concentration of about $10^{16}$ atoms cm$^{-2}$.

A mesa structure is then formed at the one major surface 1a in the following manner. Firstly, a thin, for example about 50 nanometers (nm), insulating layer 13 of silicon oxide or silicon oxynitride is provided on the one major surface 1a followed by a first silicon nitride layer 14 having a thickness of about 100 nm to form an anti-oxidation layer and an undoped polycrystalline silicon layer having a thickness of about 1.2 μm (micrometers). The undoped polycrystalline silicon layer is defined by conventional photolithographic and etching processes and is subjected to a conventional thermal oxidation treatment to produce an oxide layer 15 on the remaining undoped polycrystalline silicon region 16.

The exposed regions of the insulating layer 13 and the first silicon nitride layer 14 are then removed using a selective etching process, for example by etching preferably in a plasma or successively in hot phosphoric acid and in a buffered solution of HF in water.

A depression is then etched into the semiconductor body 1 using the oxide layer 15 as a mask. The depression may be in the form of a groove having a depth of about 0.8 μm so that the groove does not extend into the relatively highly doped region 11.

A further anti-oxidation layer comprising a silicon oxide layer 17 which is, typically, 50 nm thick and a second silicon nitride layer which is, typically, 150 nm thick is then provided over the exposed surface. The silicon nitride layer is etched anisotropically, for example using a carbon hydrofluoride plasma etching process, to remove the parts of the silicon nitride layer lying on surfaces parallel to the epitaxial layer forming the relatively lowly doped subsidiary region 12 of the collector region 10, so as to leave an anti-oxidation mask silicon nitride region 18 on a side wall 41 of the mesa structure 40 defined by the depression or groove as shown in FIG. 1.

Figure 2:
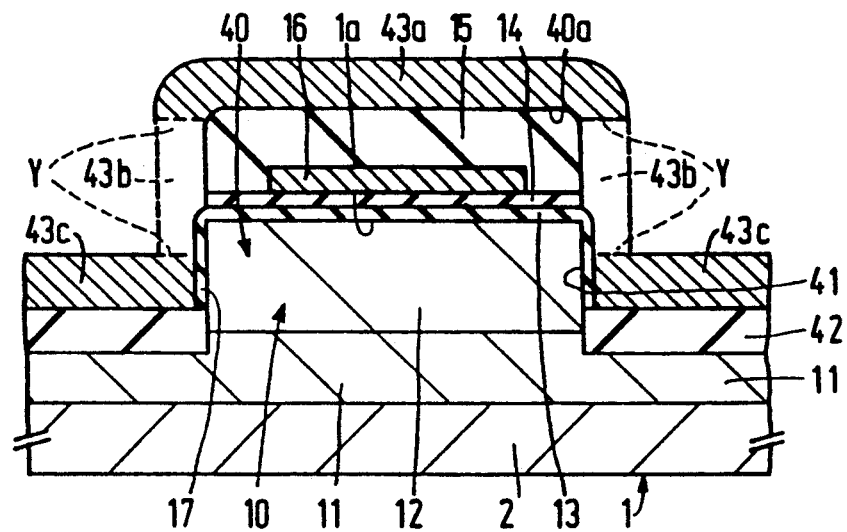

The exposed silicon surfaces are then subjected to a conventional thermal oxidation treatment to form a first countersunk oxide region 42 bounding the mesa structure 40 as shown in FIG. 2. The silicon nitride second anti-oxidation mask region 18 is then removed by conventional techniques. Alternatively, the silicon nitride region 18 could be left in place.

A layer 43 of undoped (that is not intentionally doped) polycrystalline silicon is then deposited over the mesa structure 40. Boron ions are then implanted into the surface of the polycrystalline silicon layer 43. Because of the anisotripic nature of the ion implantation, boron ions are implanted into the surfaces of the polycrystalline silicon regions 43a and 43c provided on the top surface 40a of the mesa structure 40 and on the countersunk oxide region 42, respectively, but not to any significant extent into the polycrystalline silicon region 43b (shown in phantom lines in FIG. 2) on the side wall 41 of the mesa structure 40.

After the implantation step, the semiconductor body 1 is subjected to a heat treatment to cause the implanted impurities to diffuse into the polycrystalline silicon. The length of diffusion time required will of course depend on the thickness of the polycrystalline silicon layer 43, but surprisingly, is not particularly critical because the rate at which the boron ions implanted into the polycrystalline silicon regions 43a and 43c diffuse into the polycrystalline silicon region 43b is significantly retarded with respect to the rate at which the implanted boron ions diffuse downwardly through the thickness of the polycrystalline silicon regions 43a and 43c. It is believed that this significant rate difference is related to the fact that diffusion of impurities across grain boundaries is more difficult and to the fact that the polycrystalline silicon grains tend to grow or be aligned so that the grain boundaries tend to be aligned perpendicularly to the underlying surface. Thus, the diffusion of the boron ions downwardly into the polycrystalline silicon regions 43a and 43c should be predominantly along grain boundaries while the diffusion direction required for the impurities to enter the polycrystalline silicon region 43b will be, predominantly, across the grain boundaries and is so is lower.

The dashed lines Y in FIG. 2 illustrate approximately the extent of the diffusion of the boron ions after the above-described diffusion process and thus show the extent of the undoped polycrystalline silicon region 43b on the side wall 41 of the step 40.

The exposed polycrystalline silicon layer 43 is then subjected to an etching process which selectively etches away the undoped polycrystalline silicon region 43b. Any suitable etchant may be used, for example potassium hydroxide or sodium hydroxide. The exposed portion of the silicon oxide layer 17 (and the exposed portion of the silicon nitride layer 18 if this was not previously removed) is then removed exposing a window area 410 (FIG. 3) of the side wall 41 of the mesa structure 40.

Of course, any other suitable method for planarizing the polycrystalline silicon layer 43 to provide the doped polycrystalline silicon region 43c could be used.

Figure 3:
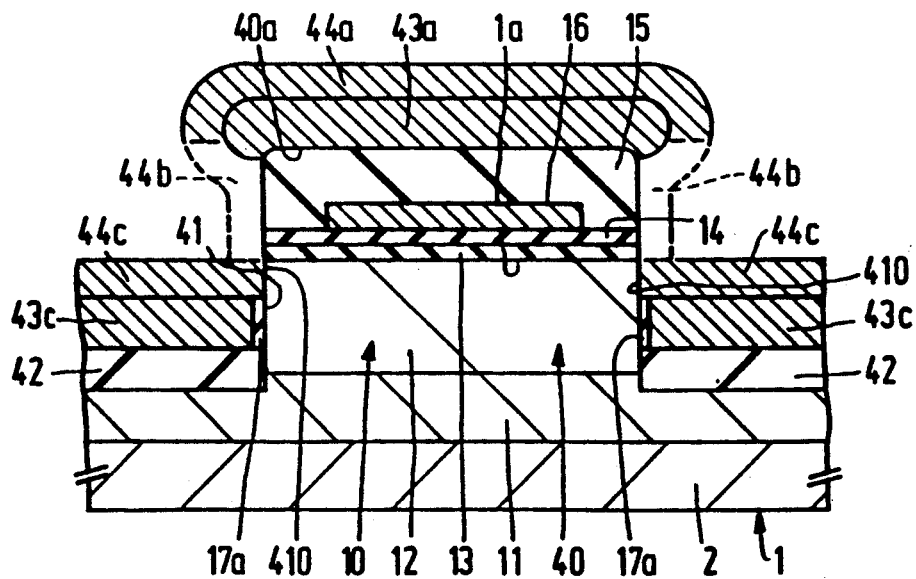
Figure 4:
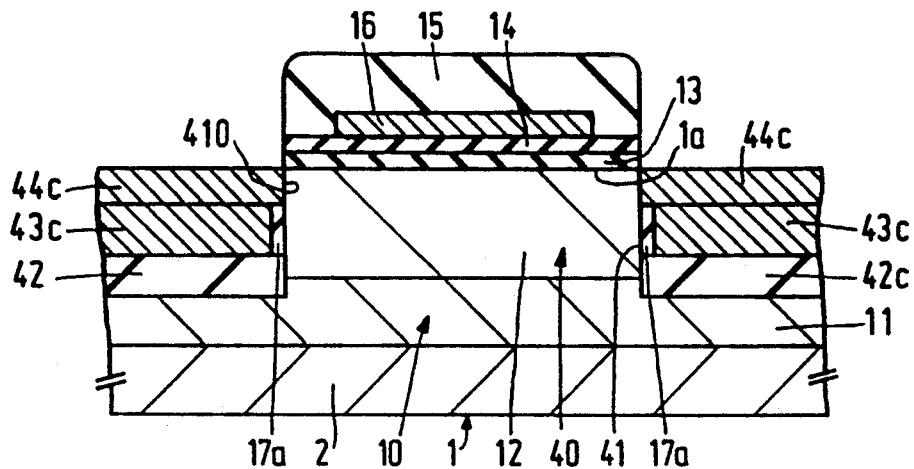

A further layer 44 of polycrystalline silicon with a thickness of about 0.6 μm is then deposited onto the structure as shown in FIG. 3. Boron ions may then be implanted into the further layer 44 as described above with reference to the polycrystalline silicon layer 43. Alternatively, because in this example the further layer 44 is provided directly onto the remaining doped regions 43a and 43c, the further polycrystalline silicon layer 44 may be doped by heating the structure so that impurities diffuse out of the doped polycrystalline silicon region 43a and 43c into the overlying regions 44a and 44c of the further polycrystalline silicon layer 44. Although not shown in FIG. 3, a thin thermal oxide layer may form on the further polycrystalline silicon layer 44.

In either case, the region 44b of the further polycrystalline silicon layer 44 (shown in phantom lines in FIG. 3) on the side wall 41 of the mesa structure remains undoped and can be removed as described above using a suitable selected etchant such as potassium or sodium hydroxide. The doped polycrystalline silicon regions 43a and 44a on the top surface 40a of the mesa structure 40 may then be removed by applying a flowable material (not shown), in this example a photosensitive resist, which is then patterned using conventional techniques to form a mask layer protecting the doped polycrystalline silicon region 44c. The exposed doped polycrystalline silicon regions 43a and 44b are then etched away to leave the structure shown in FIG. 4.

Figure 5:
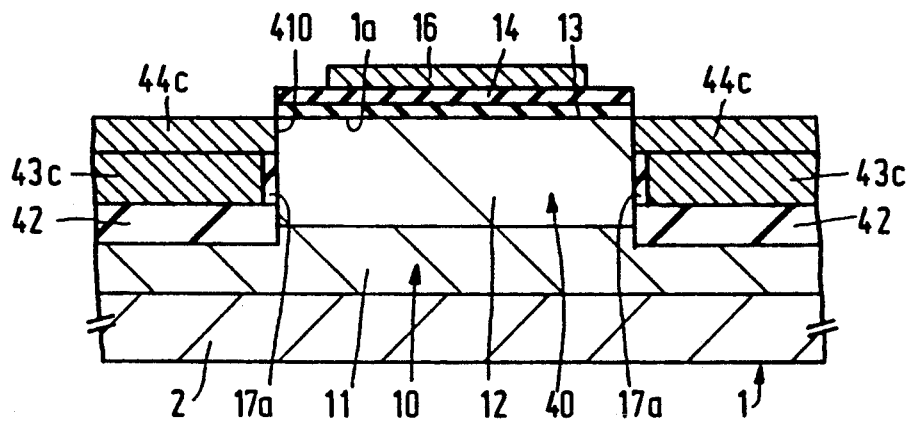
Figure 6:
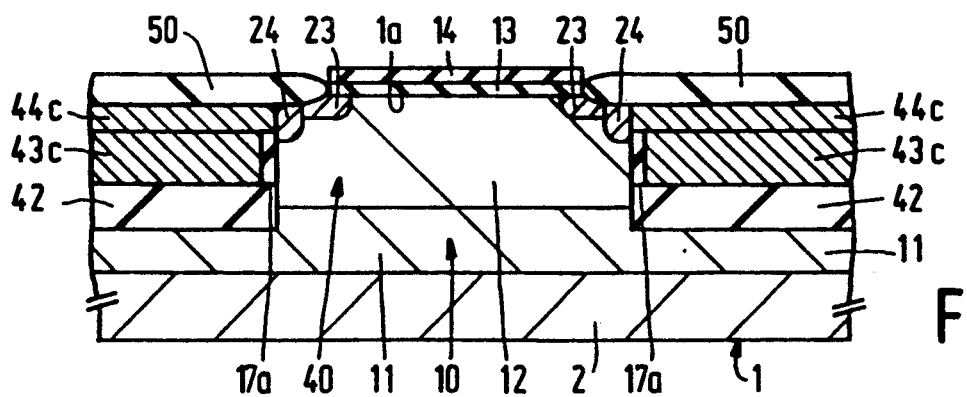

The oxide layer 15 is then etched away and acceptor ions, for example boron ions, are implanted for defining a p conductivity type intermediate region 23 adjoining the p conductivity type polycrystalline silicon region 44c as shown in FIG. 5. Alternatively, the acceptor ions may be implanted after removal of the undoped polycrystalline silicon region 16.

The undoped polycrystalline silicon region 16 is then removed using an appropriate selective etchant, for example potassium hydroxide or sodium hydroxide as described above, and the exposed silicon is provided with a second oxide layer 50 by thermal oxidation in a manner similar to that used to form the countersunk oxide layer 42. During the high temperature processing to form the second oxide layer 50, the diffusion of p type impurities out of the doped polycrystalline silicon region 44c into the mesa structure 40 via the window area 410 results in a highly doped p conductivity type contact region 24 between the doped polycrystalline silicon region 44c and the intermediate region 23 to produce the structure shown in FIG. 6. The contact region 24 and the intermediate region 23 together form the extrinsic base region of the bipolar transistor.

Figure 7:
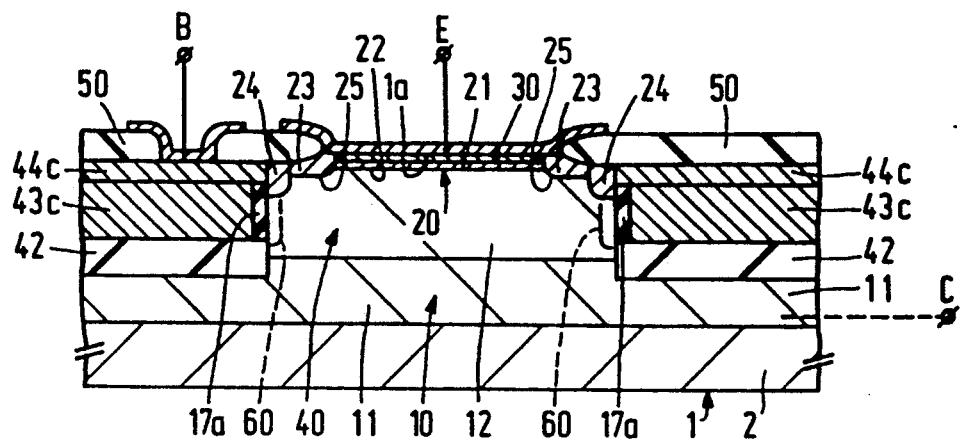
FIG. 7 is a schematic cross-sectional view of a bipolar transistor in accordance with the first embodiment.

The remaining silicon oxide and silicon nitride layers 13 and 14 are then etched away and p conductivity type impurities and subsequently n conductivity type impurities are then implanted to form, as shown in FIG. 7, the intrinsic type base region 21 which is connected via the intermediate device region 23 and the contact region 24 of the extrinsic base region to the doped polycrystalline silicon region 44c and an n conductivity type emitter region 30 within the relatively lowly doped region 12 of the collector region.

Contact windows are then opened in the usual manner and metallization applied to form the base B and emitter E contacts so that the polycrystalline silicon region 44c forms a doped connection layer between the base electrode B and the base region 21,23,24 of the bipolar transistor. Although not shown in FIG. 7, electrical C contact is made to the highly doped subsidiary region 11 of the collector region in conventional manner by means of a highly doped contact region (not shown) extending to the highly doped subsidiary region 11 and isolated by insulating regions from the remainder of the transistor. The device shown in FIG. 7 may be rotationally symmetric about the center of the emitter region 30 so that the doped polycrystalline silicon regions 43c and 44c each form a continuous annulus. Where this is the case, then it will of course be necessary to isolate the collector contact region from the doped polycrystalline silicon region 43c and 44c in known manner. Alternatively where the device is not rotationally symmetric about the emitter region so that the doped polycrystalline silicon region 44c is not electrically connected to the doped polycrystalline silicon region 44c, then the method described in EP-A-0 300 514 may be used to enable contact to be made to the collector region 10.

As can be seen from FIG. 7, the doped polycrystalline silicon region 43c forms a doped layer in electrical contact with the doped polycrystalline silicon region 44c and separated from the side wall 41 of the mesa structure 40 by a thin insulating layer provided by the remaining portion 17a of the silicon oxide layer 17 (and the remaining portion 18a of the silicon nitride layer 18, if present). The doped polycrystalline silicon region 43c thus serves to define the additional region as a depletion layer region 60 (shown in phantom lines in FIG. 7) within which a depletion layer, or possibly even an inversion channel depending upon the applied voltage, is formed upon application of a voltage to the base electrode B. In addition, the thin layer of insulating material 17a serves to prevent diffusion of impurities from the doped polycrystalline silicon region 43c into the mesa structure so that the window via which the impurities for forming the contact region 24 enter the mesa structure 40 is restricted to the area adjacent the doped polycrystalline silicon region 44c so ensuring that the contact region 24 is spaced from the relatively highly doped subsidiary region 11 of the collector region 10, thereby avoiding an excessively high extrinsic base-collector capacitance which could otherwise adversely affect the high frequency performance of the device.

Figure 8:
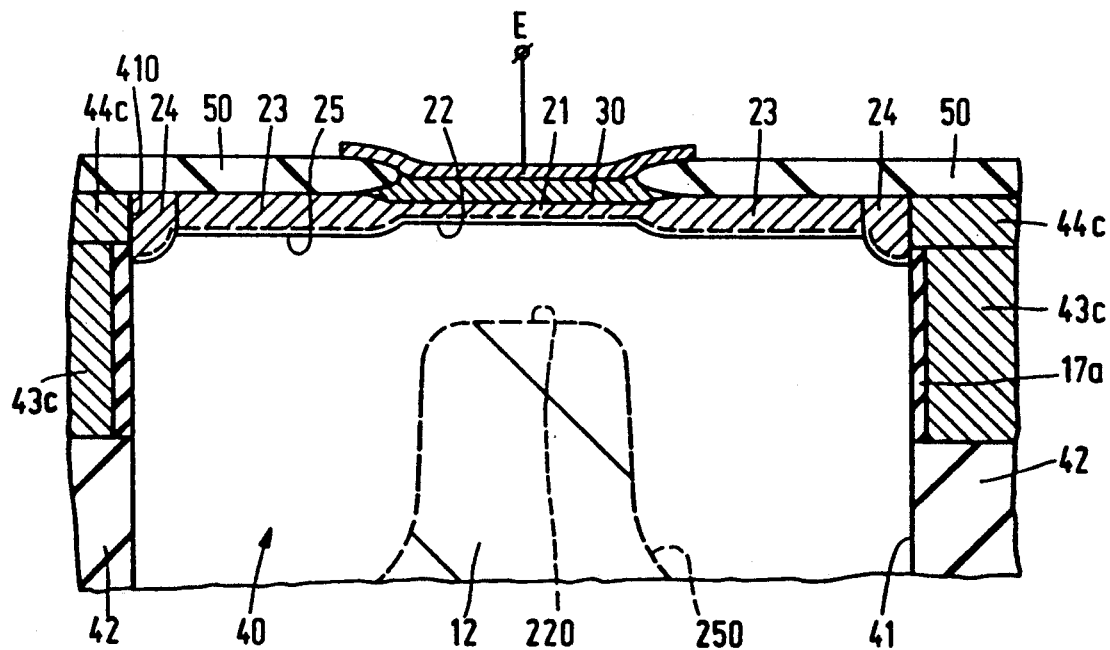
FIG. 8 is a schematic enlarged cross-sectional view of part of a bipolar transistor in accordance with the first embodiment.

FIG. 8 is a cross-sectional view on an enlarged scale of part of the mesa structure 40 of the bipolar transistor shown in FIG. 7. When, in the at least one mode of operation of the bipolar transistor, the first and second pn junctions 22 and 25 are reverse-biassed by voltages applied to the electrodes of the device, the voltage applied to the base electrode B which is in electrical contact via the doped polycrystalline silicon region 44c with the doped polycrystalline silicon region 43c causes a depletion region or possibly even an inversion channel, to be formed in the depletion layer region 60 adjacent the thin insulating layer 17a thereby extending the depletion region 250 associated with the second pn junction 25 so that, as shown in FIG. 8, the depletion region 250 extends beneath the third device region 30 and overlaps with the depletion region 220 associated with the first pn junction 22. As will be explained in more detail below, this extension of the depletion region 250 effectively increases the space charge region associated with the first pn junction 22 resulting in a reduction of the intrinsic base-collector capacitance and so an increased (that is more negative) Early voltage $V_{eaf}$. In addition this extension of the depletion region 250 causes a reduction in the effective doping concentration of the relatively lowly doped subsidiary region 12 resulting in an increased reverse collector-base breakdown voltage.

Figure 9:
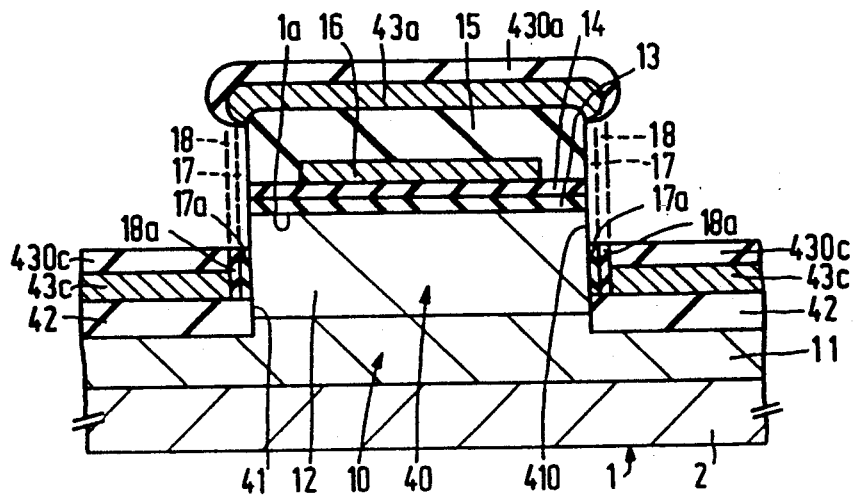
FIGS. 9 and 10 are schematic cross-sectional views similar to FIGS. 1 to 7 for illustrating steps in a method of manufacturing a second embodiment of a bipolar transistor in accordance with the invention.
Figure 10:
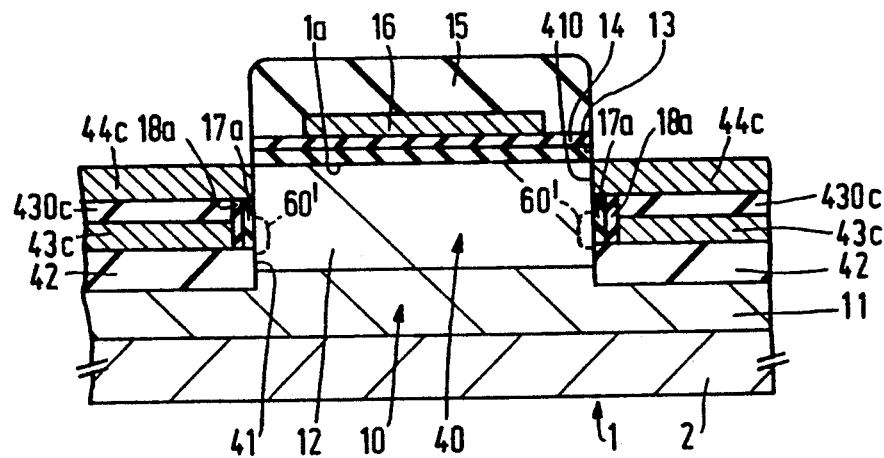
Figure 11:
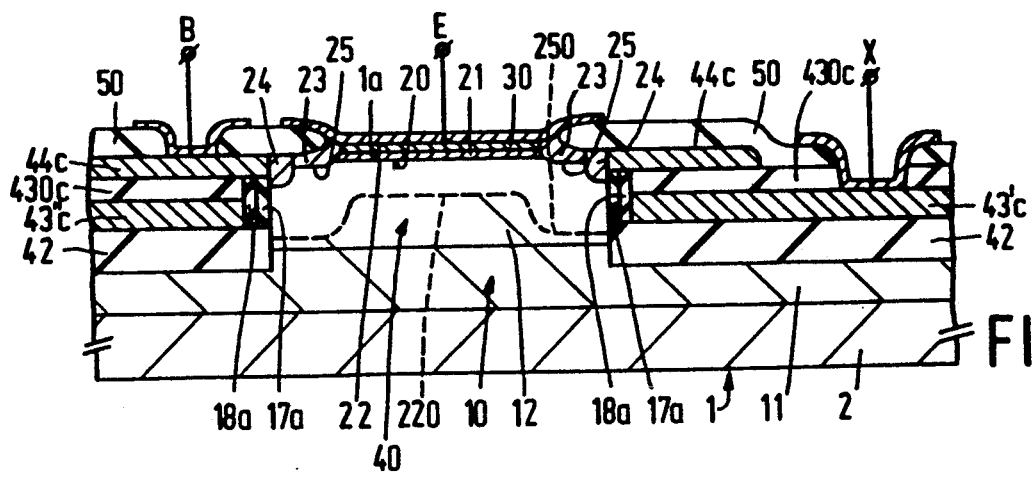
FIG. 11 is a schematic cross-sectional view of a bipolar transistor in accordance with the second embodiment.

FIGS. 9 to 11 are cross-sectional views similar to FIGS. 1 to 7 for illustrating a modified version of the method described above for producing a second embodiment of a bipolar transistor in accordance with the invention.

In this example, after the thermal oxidation treatment to form the first countersunk oxide region 42, the anti-oxidation mask region 18 is left in place and the polycrystalline silicon layer 43 then deposited and doped as described above. Once the undoped region 43b of the polycrystalline silicon layer 43 has been selectivity etched away as described above, instead of depositing the further polycrystalline silicon layer 44 directly onto the doped polycrystalline silicon regions 43a and 43c, the doped polycrystalline silicon regions are first subjected to an oxidation treatment which partially oxidises the doped polycrystalline silicon region to form oxide regions 430a and 430c as shown in FIG. 9.

The exposed portion of the anti-oxidation silicon nitride mask region 18 and the silicon oxide layer 17 are then removed and the further polycrystalline silicon layer 44 is deposited and implanted with boron ions as described above enabling the undoped polycrystalline silicon region 44b (not shown in FIG. 9) to be selectively etched away.

A flowable material (not shown) may then be applied as described above to form a mask layer which protects or covers the doped polycrystalline silicon region 44c while exposing the doped polycrystalline silicon region 44a. The exposed doped polycrystalline silicon region 44a, underlying oxide region 430a and doped polycrystalline silicon region 43a may then subsequently be etched away to leave the structure shown in FIG. 10.

Further processing steps are then carried out as described above with reference to FIGS. 5 and 6, resulting in the structure shown in FIG. 11. In this case, it is necessary also to enable electrical contact X to be made to the doped polycrystalline silicon region 43c. Where the device is rotationally symmetric about the emitter region 30 so that the doped polycrystalline regions 43c and 44c each form a continuous annulus, this may be achieved by use of an appropriate mask during the deposition and doping of the polycrystalline silicon layer 44 so that, as shown in FIG. 11, the doped polycrystalline silicon region 44c is defined to enable electrical contact to be made to the doped polycrystalline silicon region 43c in conventional manner without shorting the electrical contact X to the base contact B. If the doped polycrystalline silicon region 43c does not form a continuous annulus then electrical contact should be made to both parts 43'c and 43"c of the doped polycrystalline silicon region 43c.

The doped polycrystalline silicon region 43c is again separated from the mesa structure by a thin insulating layer formed by the remaining portion 17a of the silicon oxide layer 17 and the remaining portion 18a of the anti-oxidation silicon nitride mask region 18, so providing a depletion layer region 60' (FIG. 10) in the mesa structure 40 adjacent the thin insulating layer 17a, 18a and beneath the extrinsic subsidiary region 23,24. Thus, upon application of an appropriate voltage to the electrical contact X to the doped polycrystalline silicon region 43c a depletion layer or even an inversion channel can be formed in the depletion layer region 60'. The thickness of the oxide region 430c and the depth of the contact region 24 are such that, as shown in FIG. 11, in the at least one mode of operation of the device when the first and second pn junctions 22 and 25 are reverse-biassed, the depletion region 250 associated with the second pn junction 25 reaches the depletion channel region 60' and is thus extended so as to overlap with the depletion region 220 associated with the first pn junction 22 as described above thereby effectively increasing the intrinsic base-collector capacitance so resulting, as will be explained in greater detail below, in an increased (that is more negative) Early voltage $V_{eaf}$ and a larger collector-base reverse breakdown voltage.

Figure 12:
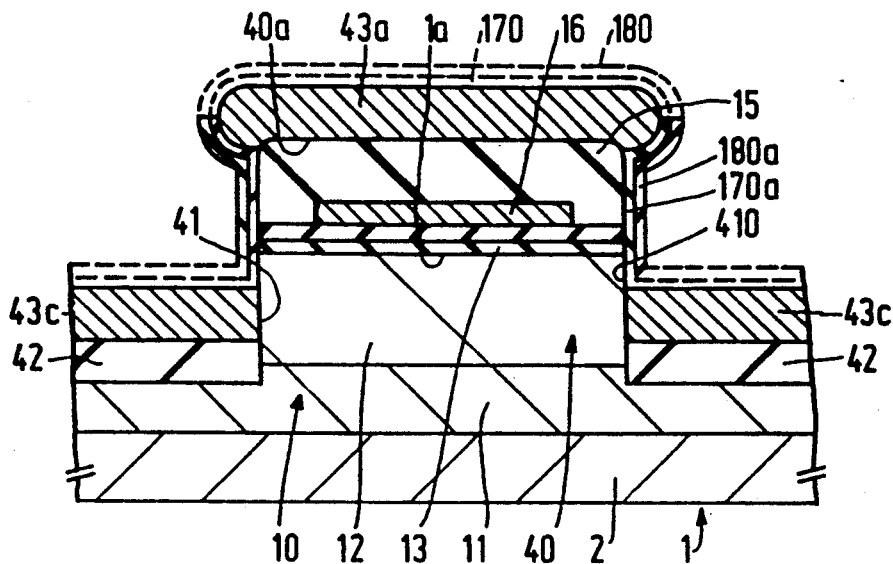
FIGS. 12 and 13 are schematic cross-sectional views similar to FIGS. 1 to 7 for illustrating steps in a method of manufacturing a third embodiment of a bipolar transistor in accordance with the invention.

A third embodiment of a bipolar transistor in accordance with the invention will now be described by reference to FIGS. 12 to 14.

In this example, the doped polycrystalline silicon region 43c is not isolated from the mesa structure by a thin insulating layer. Rather, the polycrystalline silicon region 43c is deliberately allowed to contact the side wall 41 of the mesa structure 40 and impurities are caused to diffuse out of the doped polycrystalline silicon region 43c into the mesa structure 40 to form a region 61 (FIGS. 13 and 14) which is highly doped with impurities of the opposite conductivity type, p conductivity type in this example.

Accordingly, in order to manufacture such a bipolar transistor, the first silicon oxide layer 17 is omitted and the anti-oxidation silicon nitride region 18 is provided directly onto the side wall of the mesa structure 40 and, after formation of the countersunk oxide region 42, the exposed portion of the anti-oxidation mask region 18 is removed to expose an area 41a of the side wall of the mesa structure 40. The polycrystalline silicon layer 43 is then deposited and implanted with boron ions as described above. After removal of the undoped polycrystalline silicon region in the manner described above, a thin thermal oxide layer 170 is grown and a further layer 180 of silicon nitride is then deposited. These layers are then etched anisotropically to remove the portions shown in phantom lines in FIG. 12 leaving a thin oxide portion 170a and a further anti-oxidation mask 180a.

Figure 13:
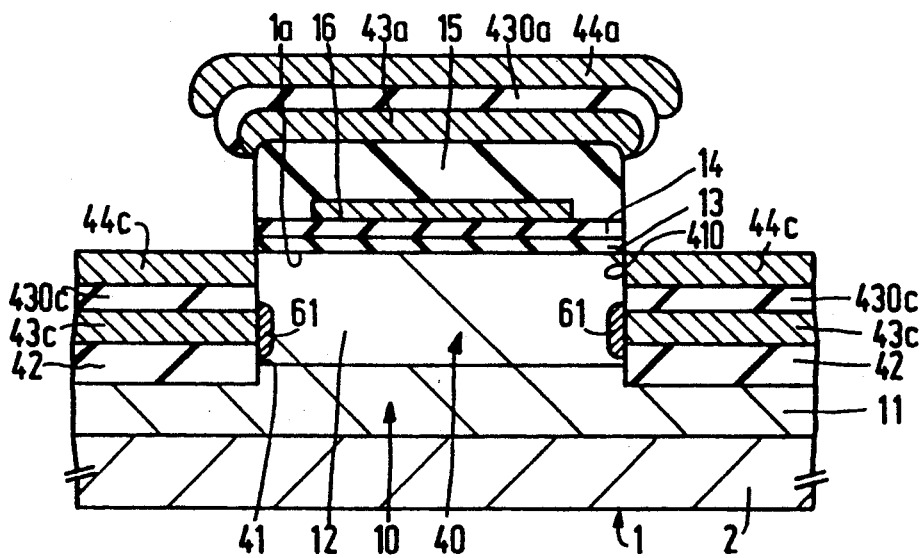

The doped polycrystalline silicon regions 43a and 43c are then partially oxidised to form oxide regions 430a and 430c (FIG. 13). During this thermal oxidation treatment, impurities are caused to diffuse out of the doped polycrystalline silicon region 43c into the mesa structure 40 to form the doped additional region 61. The further polycrystalline silicon layer 44 is then deposited as described above and boron ions implanted enabling, as described above with reference to FIG. 3, the undoped polycrystalline silicon region 44b to be selectively etched away to produce the structure shown in FIG. 13.

A flowable material (not shown) may then be applied as described above to protect the doped polycrystalline silicon region 44c while the doped polycrystalline silicon region 44a, underlying oxide region 430a and doped polycrystalline silicon region 43a are etched away leaving a structure similar as to that shown in FIG. 10 except that the doped polycrystalline silicon region 43c contacts the side wall 41 of the mesa structure to allow the out-diffusion of impurities to form the doped additional region 61. The further process steps described above with reference to FIGS. 5 and 6 are then carried out and the usual electrodes provided resulting in the bipolar transistor structure shown in FIG. 14.

The relative thicknesses of the doped polycrystalline silicon regions 43c and 44c and the oxide region 430c are such that in the at least one mode of operation of the device when the first and second pn junction 22 and 25 are reverse-biassed, the additional region 61 lies within the spread of the depletion region 250 of the second pn junction 25 and so causes this depletion region to be extended laterally beneath the emitter region 30 so as to overlap with the depletion region 220 associated with the first pn junction 22 thereby effectively increasing the intrinsic base-collector capacitance and thus resulting in a higher Early voltage $V_{eaf}$. Although FIG. 14 shows the additional region 61 as being separated from the contact region 24 and thus floating (i.e. not electrically connected), this need not necessarily be the case. Thus, the spacing of the doped polycrystalline silicon regions 43c and 44c and the diffusion of impurities out of the doped polycrystalline silicon region 43c could be such that the additional region 61 merges with the contact region 24. This would however be at the expense of an increased extrinsic base-collector capacitance and thus a worse high frequency performance.

Figure 14:
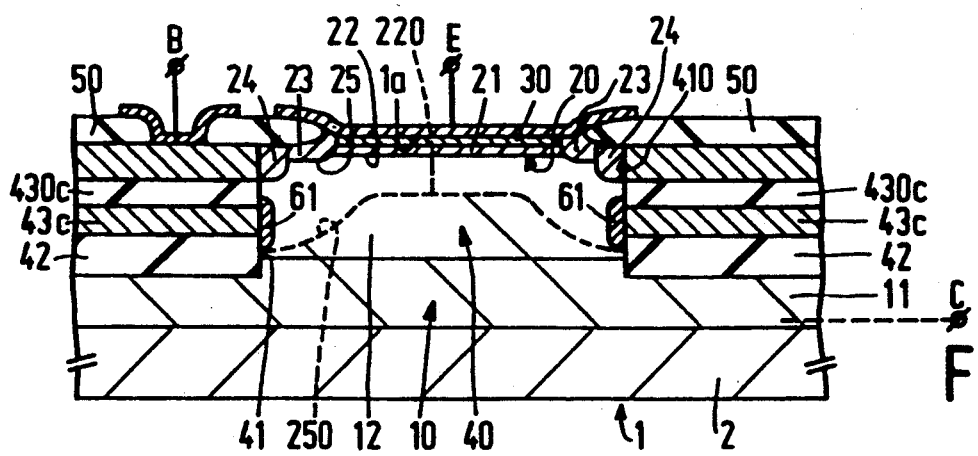
FIG. 14 is a schematic view similar to FIG. 7 of a bipolar transistor in accordance with the third embodiment.
Figure 15:
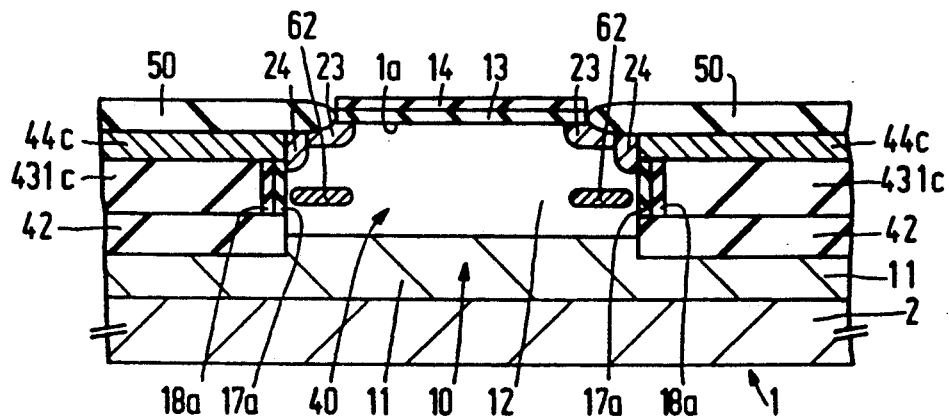
FIG. 15 is a schematic cross-sectional view similar to FIGS. 1 to 7 for illustrating steps in a method of manufacturing a fourth embodiment of a bipolar transistor in accordance with the invention.
Figure 17:
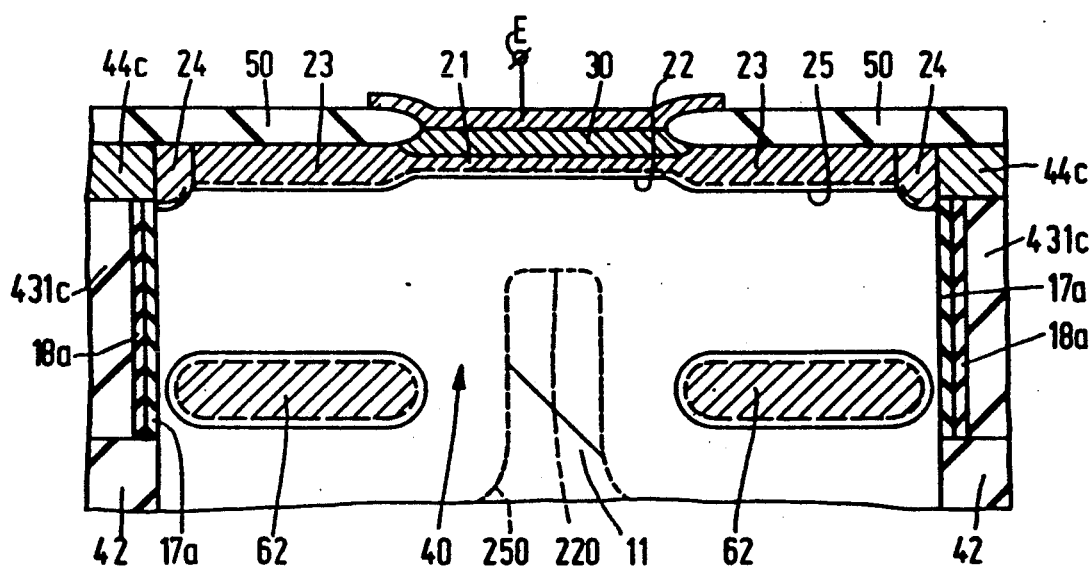
FIG. 17 is a schematic enlarged cross-sectional view of part of a bipolar transistor in accordance with the fourth embodiment.

FIGS. 15 to 17 illustrate the manufacture of a further embodiment of a bipolar transistor in accordance with the invention which is somewhat similar to that described with reference to FIGS. 12 to 14 but in which the highly doped additional region 61 is formed by implantation of impurities via the one major surface 1a rather than by the diffusion of impurities into the mesa structure 40 from a doped layer 43c adjoining the side wall 41 of the mesa structure 40. In this example the doped layer 43 may be omitted and replaced by a thicker countersunk oxide region 42. Alternatively, the polycrystalline silicon layer 43 may be deposited and doped as described above and then, after removal of the undoped polycrystalline silicon region 43b, the doped polycrystalline silicon regions 43a and 43c completely oxidized to form oxide regions.

After removal of the exposed portions of the anti-oxidation silicon layer 17, the further polycrystalline silicon layer 44 is then be deposited and doped as described above again enabling the selective removal of the undoped polycrystalline silicon region 44b. A flowable material (not shown) may then be applied to define a mask layer enabling the doped polycrystalline silicon region 44c to be protected while the exposed doped polycrystalline silicon region 44a, underlying oxide region and oxide layer 15 (not shown in FIG. 15) are selectively removed leaving an oxide region 431c beneath the doped polycrystalline silicon region 44c and on top of the countersunk oxide region 42. After removal of the oxide layer 15, boron ions are implanted using the polycrystalline region 16 and oxide region 431c as a mask with two different energies. A first relatively high energy dose is used to form the relatively highly doped region 62 and a second relatively low energy dose to form the intermediate region 23 of the extrinsic base region 23,24 as shown in FIG. 15. The processing then proceeds as described above with reference to FIG. 6 producing the bipolar transistor structure shown in FIG. 16.

The implantation energy and dose used to form the additional region 62 may be adjusted as desired to achieve the desired device characteristics. Thus, for example a relatively lowly doped additional region 62 well spaced from the highly doped subsidiary region 11 of the collector region 10 should result in a device with an improved Early voltage and reasonable high frequency characteristics while a relatively highly doped deep additional region 62 should result in an even better Early voltage but at the expense of the high frequency performance because of the increased base-collector capacitance. It should also be possible to tailor the structure for required device characteristics by adjusting the shape of the additional region. Thus, for example, it may be desirable for the additional region 62 to be relatively large in the lateral direction (that is parallel to the one major surface 1a) so as to ensure that the depletion region 250 extends laterally under the emitter region while being shallow (that is of small extent perpendicular to the one major surface 1a) so as to avoid significant increase of the base-collector capacitance.

In addition to the above, because in the arrangement shown in FIGS. 15 to 17 the additional region 62 is formed in a self-aligned manner by ion-implantation, it is possible to form devices both with and without additional regions 62 in the same semiconductor body by using an appropriate mask to mask the devices where the additional regions 62 are not required during the implantation step. This would allow devices with relatively high Early voltages and breakdown voltages to be formed in the same semiconductor body as devices with relatively low Early and breakdown voltage but with very good high frequency characteristics. This could be particularly advantageous in, for example, the manufacture of analog bipolar integrated circuits for use in television sets where bipolar transistors with good high frequency characteristics are required in the antenna stage while bipolar transistors with high Early and breakdown voltages are required in the amplifying and down-converter stages.

As will be explained in greater detail below and as shown in FIG. 17, as the additional region 62 lies within the spread of the depletion region 250 of the second pn junction 25 when the first and second pn junctions 22 and 25 are reverse-biassed in the one mode of operation of the device, the additional region 62 acts to spread the depletion region 250 so that it extends beneath the emitter region 30 and overlaps with the depletion region 220 of the first pn junction, thus effectively reducing the intrinsic base-collector capacitance and so resulting in a higher Early voltage $V_{eaf}$ and breakdown voltage.

In each of the examples described above, an additional region is provided which, when the first and second pn junctions 22 and 25 are reverse-biassed in the at least one mode of operation of the device, acts to extend the depletion region 250 associated with the second pn junction 25 beneath the emitter region 30 so that it overlaps with the depletion region 220 associated with the first pn junction 22 thereby effectively increasing the space-charge region associated with the first pn junction 22 and reducing the intrinsic base collector capacitance.

As mentioned above, the overlapping of the depletion region 250 with the depletion region 220 effectively causes an increase in the space charge region associated with the intrinsic base region 21 so resulting in a reduction of the intrinsic base-collector capacitance. The Early voltage $V_{eaf}$ when the base-collector voltage Vcb=0 is given by $$V_{eaf} = Qbo/(Ccb.Xcjc)$$

where Qbo is the undepleted charge between the emitter region 30 and the relatively highly doped collector region 12, Ccb is the collector-base capacitance at Vcb=0 and Xcjc is the portion of the collector-base capacitance due to the intrinsic base region 21. Accordingly by effectively causing a reduction in the intrinsic base-collector capacitance for a given Qbo, the Early voltage $V_{eaf}$ is increased with the increase in the Early voltage being greater the greater degree of overlap of the depletion region 250 with the depletion region 220, that is the greater the lateral extent of the depletion region 250 beneath the emitter region 30.

As will be appreciated by those skilled in the art, the amount by which the depletion region extends under the emitter region will be determined by the characteristics of the additional region and also of course the dopant concentration of the relatively lowly doped subsidiary region 12 of the collector region 10. A greater lateral extent of the depletion region beneath the emitter region 30 should be achieved for the devices shown in FIGS. 14 and 16, especially FIG. 16, than for the devices shown in FIGS. 8 and 11 because the depletion region associated with the addition regions will extend from the periphery of the additional region which will of course, be closer (in a lateral sense) to the emitter region 30 in the cases shown in FIGS. 14 and 16, especially FIG. 16. On the other hand, the additional regions 61,62 will have a greater adverse effect on the extrinsic base-collector capacitance, and thus the high frequency performance, than the depletion layer regions 60,60' of the devices shown in FIGS. 8 and 11.

For a typical dopant concentration of the lowly doped subsidiary region 12, the depletion region associated with the additional region 60,60',61 or 62 will extend about one micrometer into the lowly doped subsidiary region and thus the amount to which the depletion region 250 is extended beneath the emitter region 30 will become more significant as the width (that is the dimension parallel to the one major surface) of the emitter region 30 is reduced relative to the other dimensions, that is while maintaining the dimensions and dopant concentration of the other regions substantially the same, with the effect being more significant for the devices shown in FIGS. 14 and 16, because the lateral extent of the depletion region 250 beneath the emitter region 30 increases as the emitter width is reduced. Typically, the overlapping of the depletion region 250 with the depletion region 220 should be particularly significant when the emitter width is less than about 5 μm.

Figure 18A:
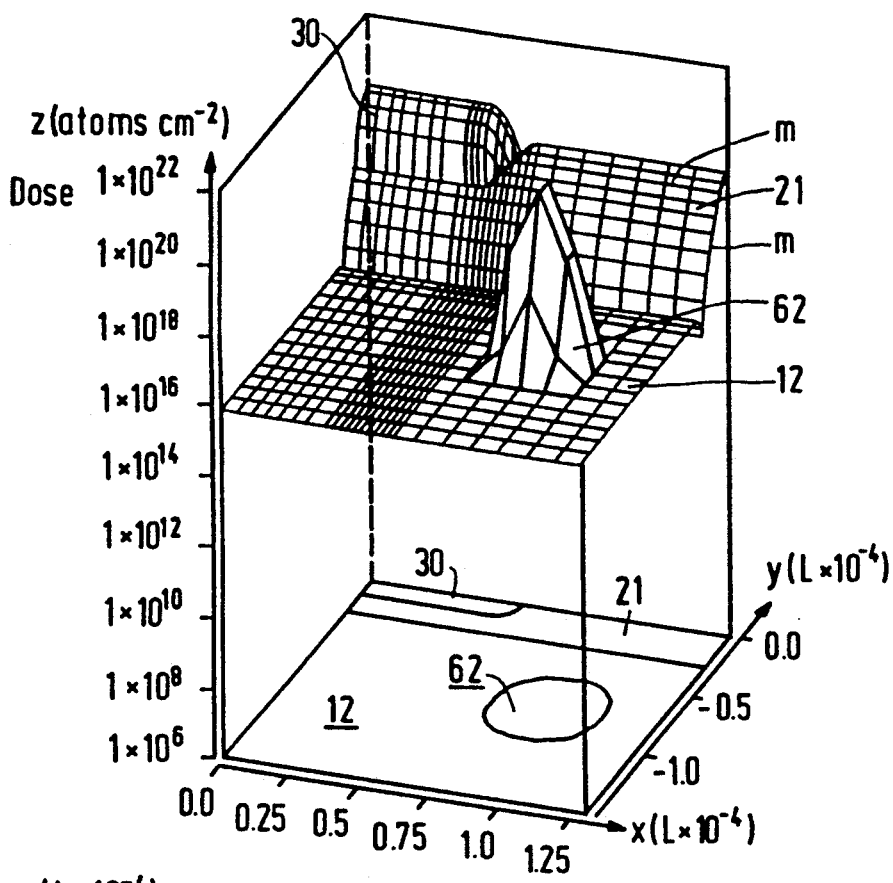
FIGS. 18a and 18b are schematic diagrams for illustrating the effect of the additional region in the fourth embodiment.
Figure 18B:
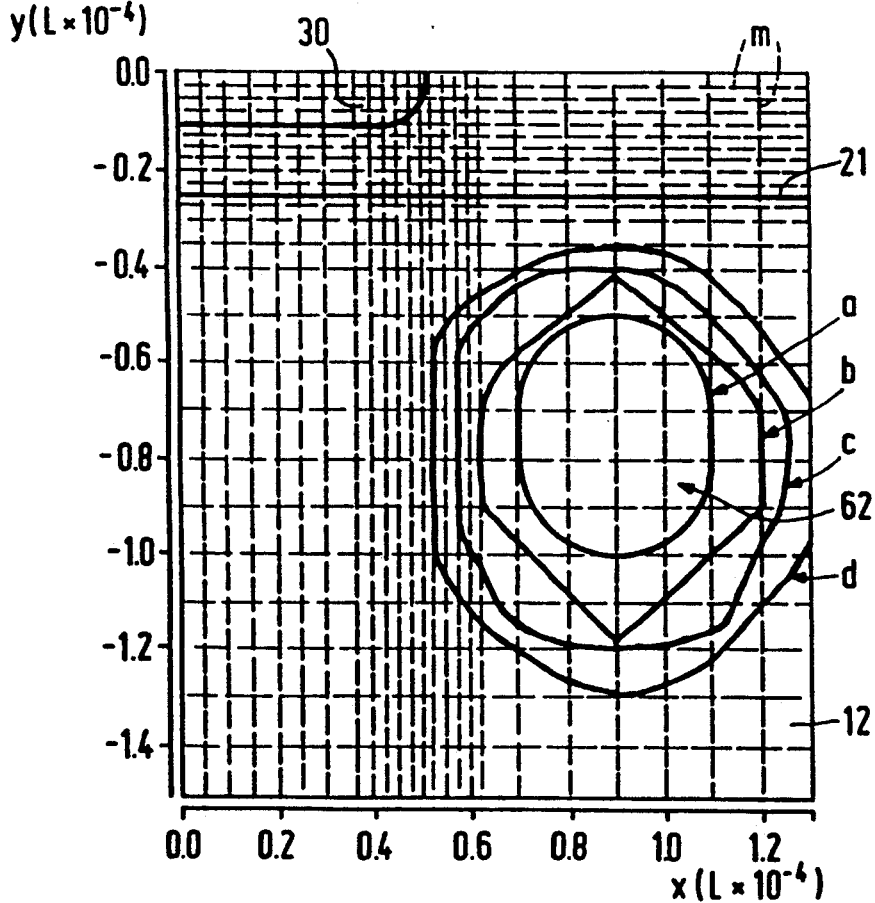

FIGS. 18a and 18b illustrate diagrammatically a simplified structure used for a computer modelling simulation to illustrate the effect of the incorporation of an additional region 62 as in the example shown in FIG. 17. FIG. 18a is a three-dimensional graph illustrating the doping profile through the simulated device by plotting dopant concentration (dose) in atoms cm$^{-2}$ along the z axis against distance in L×10$^{-4}$ parallel to the one major surface 1a along the x axis and distance in L×10$^{-4}$ perpendicular to the one major surface 1a along the y axis with the line x=0 running through the center of the emitter region 30. FIG. 18b is a corresponding two-dimensional graph (with the computer mesh lines M shown as dashed lines) of x in L×10$^{-4}$ against y in L×10$^{-4}$. L may be selected appropriately so that for example the width of the emitter region 30 is just over 10 micrometers (L=0.1 m) or just over 5 micrometers (L=0.05 meters). The doping profile of the intrinsic base region 21 reasonably corresponds to the actual profile which would be used in a device but the doping profile of the extrinsic base region 23,24 has been simplified. FIG. 18b shows the provision of additional floating regions 62 of different sizes labelled a,b,c,d. The dopant concentration at the top (that is the portion of the additional region 62 closest the extrinsic base region is taken to be 1×10$^{21}$ atoms cm$^{-2}$.

In this particular computer simulation, $V_{eaf}$ is found to increase with increase in the size of the additional region 62, because this in effect increases the space charge region and thus further reduces the intrinsic base-collector capacitance, while hfe remains approximately constant. Thus for the different sizes a,b,c,d for the additional region 62, Early voltages $V_{eaf}$ of 75.2, 106, 137 and 166 Volts, respectively, were calculated corresponding to current amplification (hfe) values of 40.5, 39.4, 31.5 and 38.

Although in the examples described above, the mesa structure 40 is formed by etching a depression into the one major surface 1a, the present invention may also be applied where the mesa structure 40 is defined by local oxidation of the silicon surface 1a and where the doped polycrystalline silicon layer 44 contacts the semiconductor body via the one major surface to enable out-diffusion of impurities to form at least part of the extrinsic base regions 23,24.

It should of course be appreciated that the polycrystalline silicon layers could be replaced by other dopable layers, for example amorphous silicon layers. Also, the conductivity types given above could be reversed and semiconductor materials other than silicon, for example a III-V material such as gallium arsenide, could be used.

From reading the present disclosure, other modifications will be apparent to persons skilled in the art. Such modifications may involve other features which are already known in the semiconductor art and which may be used instead of or in addition to features already described herein.

We claim:

1. A semiconductor device comprising a semiconductor body having adjacent one major surface a first device region of one conductivity type having a relatively highly doped subsidiary region spaced from the one major surface by a relatively lowly doped subsidiary region defining a mesa structure having a side wall bounded by an insulating region, a second device region of the opposite conductivity type formed within the relatively lowly doped subsidiary region of the first device region adjacent the one major surface and having an intrinsic subsidiary region forming a first pn junction with the relatively lowly doped subsidiary region and an extrinsic subsidiary region surrounding the intrinsic subsidiary region and forming a second pn junction with the relatively lowly doped subsidiary region, the first and second pn junctions being reverse-biassed in at least one mode of operation of the device, and a third device region of the one conductivity type formed within the intrinsic subsidiary region adjacent the one major surface, an additional region comprising a relatively highly doped floating region of the opposite conductivity type being formed in the mesa structure beneath the extrinsic subsidiary region by diffusion of impurities from a doped layer provided on the insulating region and adjoining the side wall of the mesa structure, the relatively highly doped floating region lying within the spread of the depletion region associated with the second pn junction when the first and second pn junctions are reverse-biassed in the one mode of operation of the device for causing the depletion region associated with the second pn junction to extend beneath the third device region so as to overlap with the depletion region associated with the first pn junction.

2. A semiconductor device according to claim 1, wherein the extrinsic subsidiary region adjoins a doped semiconductor connection layer provided on the insulating region with at least a contact portion of the extrinsic subsidiary region being provided by diffusion of impurities from the doped semiconductor connection layer.

3. A semiconductor device comprising a semiconductor body having adjacent one major surface a first device region of one conductivity type having a relatively highly doped subsidiary region spaced from the one major surface by a relatively lowly doped subsidiary region, a second device region of the opposite conductivity type formed within the relatively lowly doped subsidiary region of the first device region adjacent the one major surface and having an intrinsic subsidiary region forming a first pn junction with the relatively lowly doped subsidiary region and an extrinsic subsidiary region surrounding the intrinsic subsidiary region and forming a second pn junction with the relatively lowly doped subsidiary region, the first and second pn junctions being reverse-biassed in at least one mode of operation of the device, and a third device region of the one conductivity type formed within the intrinsic subsidiary region adjacent the one major surface, an additional region comprising a floating region which is relatively highly doped with impurities of the opposite conductivity type being provided beneath the extrinsic subsidiary region and lying within the spread of the depletion region associated with the second pn junction when the first and second pn junctions are reverse-biassed in the one mode of operation of the device for causing the depletion region associated with the second pn junction to extend beneath the third device region so as to overlap with the depletion region associated with the first pn junction.

4. A semiconductor device according to claim 3, wherein the relatively lowly doped subsidiary region of the first device region defines a mesa structure having a side wall bounded by an insulating region.

5. A semiconductor device according to claim 3, wherein the extrinsic subsidiary region adjoins a doped semiconductor connection layer provided on the insulating region with at least a contact portion of the extrinsic subsidiary region being provided by diffusion of impurities from the doped semiconductor connection layer.

6. A semiconductor device comprising a semiconductor body having adjacent one major surface a first device region of one conductivity type having a relatively highly doped subsidiary region spaced from the one major surface by a relatively lowly doped subsidiary region defining a mesa structure having a side wall bounded by an insulating region, a second device region of the opposite conductivity type formed within the relatively lowly doped subsidiary region of the first device region adjacent the one major surface and having an intrinsic subsidiary region forming a first pn junction with the relatively lowly doped subsidiary region and an extrinsic subsidiary region surrounding the intrinsic subsidiary region and forming a second pn junction with the relatively lowly doped subsidiary region, the first and second pn junctions being reverse-biassed in at least one mode of operation of the device, and a third device region of the one conductivity type formed within the intrinsic subsidiary region adjacent the one major surface, a doped semiconductor layer isolated from the extrinsic subsidiary region being provided on the insulating region separated from the side wall of the mesa structure by a thin insulating layer for defining a depletion layer region beneath the extrinsic subsidiary region and lying within the spread of the depletion region associated with the second pn junction when the first and second pn junctions are reverse-biassed in the one mode of operation of the device and means for applying a voltage to the doped semiconductor layer to form within the depletion layer region a depletion layer for causing the depletion region associated with the second pn junction to extend beneath the third device region so as to overlap with the depletion region associated with the first pn junction in the one mode of operation.

7. A semiconductor device according to claim 6, wherein the extrinsic subsidiary region adjoins a doped semiconductor connection layer provided on the insulating region with at least a contact portion of the extrinsic subsidiary region being provided by diffusion of impurities from the doped semiconductor connection layer.

8. A semiconductor device comprising a semiconductor body having adjacent one major surface a first device region of one conductivity type having a relatively highly doped subsidiary region spaced from the one major surface by a relatively lowly doped subsidiary region defining a mesa structure having a side wall bounded by an insulating region, a second device region of the opposite conductivity type formed within the relatively lowly doped subsidiary region of the first device region adjacent the one major surface and having an intrinsic subsidiary region forming a first pn junction with the relatively lowly doped subsidiary region and an extrinsic subsidiary region surrounding the intrinsic subsidiary region and forming a second pn junction with the relatively lowly doped subsidiary region, the first and second pn junctions being reverse-biassed in at least one mode of operation of the device, and a third device region of the one conductivity type formed within the intrinsic subsidiary region adjacent the one major surface, a doped semiconductor layer being provided on the insulating region separated from the side wall of the mesa structure by a thin insulating layer for defining a depletion layer region beneath the extrinsic subsidiary region and lying within the spread of the depletion region associated with the second pn junction when the first and second pn junctions are reverse-biassed in the one mode of operation of the device and a doped semiconductor connection layer being located along and in contact with only the side of the mesa structure so as to provide at least a contact portion of the extrinsic subsidiary region by diffusion of impurities from the doped semiconductor connection layer into the relatively lowly doped subsidiary region via the side wall of the mesa structure, the doped semiconductor connection layer being in electrical contact with the doped semiconductor layer for forming within the depletion layer region a depletion layer causing the depletion region associated with the second pn junction to extend beneath the third device region so as to overlap with the depletion region associated with the first pn junction when the first and second pn junctions are reverse-biassed in the one mode of operation.

* * * * *